United States Patent
Wang

(10) Patent No.: US 11,360,602 B2
(45) Date of Patent: Jun. 14, 2022

(54) DISPLAY DEVICE, TOUCH DISPLAY PANEL AND DRIVING METHOD THEREOF

(71) Applicant: BOE TECHNOLOGY GROUP CO., LTD., Beijing (CN)

(72) Inventor: Ming Hsi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 582 days.

(21) Appl. No.: 16/301,763

(22) PCT Filed: Apr. 12, 2018

(86) PCT No.: PCT/CN2018/082783
§ 371 (c)(1),
(2) Date: Nov. 15, 2018

(87) PCT Pub. No.: WO2018/214664
PCT Pub. Date: Nov. 29, 2018

(65) Prior Publication Data
US 2021/0232258 A1    Jul. 29, 2021

(30) Foreign Application Priority Data
May 26, 2017   (CN) .......................... 201710386519.1

(51) Int. Cl.
G06F 3/041   (2006.01)
G06F 3/044   (2006.01)
H01L 27/32   (2006.01)

(52) U.S. Cl.
CPC ........ *G06F 3/04166* (2019.05); *G06F 3/0412* (2013.01); *G06F 3/0418* (2013.01);
(Continued)

(58) Field of Classification Search
CPC ......... G06F 2203/04107; G06F 3/0445; G06F 3/041–0412; G02F 1/136218; G02F 1/13606; H01L 27/323
See application file for complete search history.

(56) References Cited

U.S. PATENT DOCUMENTS

2012/0050175 A1   3/2012   Kao et al.
2013/0162560 A1*  6/2013   Sun ....................... G06F 3/0418
                                                           345/173
(Continued)

FOREIGN PATENT DOCUMENTS

CN   101414070 A   4/2009
CN   201352340 Y   11/2009
(Continued)

OTHER PUBLICATIONS

Search Report and Written Opinion for International Application No. PCT/CN2018/082783 dated Jun. 27, 2018.

*Primary Examiner* — Sanjiv D. Patel
(74) *Attorney, Agent, or Firm* — Calfee, Halter & Griswold LLP

(57) ABSTRACT

The present disclosure relates to a touch display panel, a driving method thereof, and a display device. The touch display panel includes: a display function layer group including a first electrode layer; a touch function layer group including a touch sensing layer which includes a first touch layer and a second touch layer; and a bonding layer group disposed between the display function layer group and the touch function layer group and including a transparent conductive layer, wherein the transparent conductive layer is configured to reduce capacitance between the touch function layer group and the first electrode layer during a touch phase.

11 Claims, 3 Drawing Sheets

(52) U.S. Cl.
CPC .......... *G06F 3/0443* (2019.05); *G06F 3/0445* (2019.05); *G06F 2203/04107* (2013.01); *H01L 27/323* (2013.01)

(56) References Cited

U.S. PATENT DOCUMENTS

| | | | | |
|---|---|---|---|---|
| 2014/0139761 | A1* | 5/2014 | Yanagawa | G06F 3/0446 349/12 |
| 2014/0368753 | A1* | 12/2014 | Cheng | G06F 3/0443 349/12 |
| 2016/0110020 | A1* | 4/2016 | Lee | G06F 3/0412 345/174 |
| 2017/0160847 | A1 | 6/2017 | Huo | |
| 2018/0267649 | A1* | 9/2018 | Ye | G06F 3/0443 |

FOREIGN PATENT DOCUMENTS

| | | |
|---|---|---|
| CN | 101414070 B | 3/2011 |
| CN | 103092450 A | 5/2013 |
| CN | 105373282 A | 3/2016 |
| CN | 103092450 B | 9/2016 |
| CN | 107203298 A | 9/2017 |

* cited by examiner

DISPLAY DEVICE, TOUCH DISPLAY PANEL AND DRIVING METHOD THEREOF

CROSS REFERENCE

The present application is a National Stage filing of International Application No. PCT/CN2018/082783, filed on Apr. 12, 2018, which is based upon and claims priority to Chinese Patent Application No. 201710386519.1, filed on May 26, 2017, and the entire contents thereof are incorporated herein by reference.

TECHNICAL FIELD

The present disclosure relates to display technologies, and in particular to a display device, a touch display panel, and a method for driving the touch display panel.

BACKGROUND

With the rapid development of display technology, touch screen, as a simple and convenient human-computer interaction scheme, is widely used in various electronic display products.

In the existing touch display technical solutions, a touch sensing layer including a touch signal detecting layer Rx and a touch signal scan layer Tx is integrated on an encapsulation layer TFE, thereby reducing the thickness of the product and realizing the flexibility of the product. However, in this technical solution, the accuracy of the touch signal detection still needs to be further improved.

Therefore, it is necessary to provide one or more touch display panels and driving methods thereof which are capable of solving the above problems.

It should be noted that the information disclosed in the background section above is only for enhancing the understanding of the background of the present disclosure, and thus may include information that does not constitute prior art known to those ordinary skilled in the art.

SUMMARY

Embodiments of the present disclosure provide a touch display panel, a method for driving the touch display panel, and a display device.

According to an embodiment of the present disclosure, there is provided a touch display panel, including:

a display function layer group configured to implement a display function and including a first electrode layer;

a touch function layer group configured to implement a touch function and including a touch sensing layer which includes a first touch layer and a second touch layer;

a bonding layer group disposed between the display function layer group and the touch function layer group and including a transparent conductive layer, wherein the transparent conductive layer is configured to reduce capacitance between the touch function layer group and the first electrode layer during a touch phase.

According to an embodiment of the present disclosure, there is provided a display device, including the touch display panel described above.

According to an embodiment of the present disclosure, there is provided a method for driving the touch display panel as described above. The method includes:

applying a same voltage signal to the transparent conductive layer and the first touch layer or the second touch layer of the touch sensing layer during a touch phase.

It should be understood that the above general description and the following detailed description are merely exemplary and explanatory and are not limiting of the present disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

DETAILED DESCRIPTION

Figure 1:
FIG. 1 schematically illustrates a structural diagram of a touch display panel according to an exemplary embodiment of the present disclosure.

Exemplary embodiments will now be described more fully with reference to the drawings. However, the exemplary embodiments can be embodied in various forms and should not be construed as being limited to the examples set forth herein; rather, these embodiments are provided so that the present disclosure will be more comprehensive and complete, and the conception of the exemplary embodiments will be fully conveyed to those skilled in the art. The described features, structures, or characteristics may be combined in any suitable manner in one or more embodiments. In the following description, numerous specific details are set forth to provide a full understanding of the embodiments of the present disclosure. However, one skilled in the art will appreciate that the technical solutions of the present disclosure can be practiced when one or more of the described specific details may be omitted or other methods, components, devices, steps, etc. may be employed. In other cases, well-known technical solutions are not shown or described in detail to avoid obscuring aspects of the present disclosure.

For ease of description, spatial relationship terms such as "below", "under", "lower", "above", "upper", etc., may be used herein to describe the relationship of an element or a feature and another element or feature (or other elements or features) as shown in the figures. It should be understood that the spatial relationship terms are intended to encompass different orientations of the device in use or in operation in addition to the orientation shown in the figures. For example, if a device in a figure is turned over, the elements that are described as "below" or "under" of other elements or features will be "above" other elements or features. Thus, the exemplary term "below" can encompass the orientations of both "above" and "under". The device may additionally be positioned (rotated 90 degrees or at other orientations) and the spatial relationship descriptors used herein may be interpreted accordingly.

The terms used herein are for the purpose of describing the specific exemplary embodiments and are not intended to be limiting of the present disclosure. As used here, the singular forms "a", "the" and their variants are intended to be in the plural, unless the context clearly indicates otherwise. It should be understood further that the terms "comprising" and/or "including" used in the present application document indicate the presence of the described features, integers, steps, operations, elements and/or components, but do not exclude the existence or addition of one or more features, integers, steps, operations, elements and/or combinations thereof.

In addition, the drawings are merely schematic illustration of the present disclosure and are not necessarily drawn to scale. The thicknesses and shapes of the various layers in the drawings do not reflect the true proportions, but are shown only for the convenience of the description of the present disclosure. The same reference numerals in the drawings denote the same or similar parts, and the repeated description thereof will be omitted. Some of the block diagrams shown in the drawings are functional entities and do not necessarily have to correspond to physically or logically separate entities. These functional entities may be implemented in software, or implemented in one or more hardware modules or integrated circuits, or implemented in different network and/or processor devices and/or microcontroller devices.

In the existing touch display implementation technical solutions, a touch sensing layer including a touch signal detecting layer Rx and a touch signal scan layer Tx is integrated on an encapsulation layer TFE, which can reduce the thickness of the product and realize the flexibility of the product. However, in this technical solution, the touch sensing layer is close to a cathode under the encapsulation layer TFE, and capacitance is generated between the touch sensing layer and the cathode, which may impose interference a touch signal during touch operations, thereby affecting the accuracy of the touch signal detection by the back-end detection IC or circuit.

In an exemplary embodiment, a touch display panel is provided. Referring to FIG. 1, the touch display panel may include: a display function layer group 110, a touch sensing layer group 120, and a bonding layer group 130.

The display function layer group 110 is configured to implement a display function, and includes a first electrode layer.

The touch function layer group 120 is configured to implement a touch function and includes a touch sensing layer which includes a first touch layer and a second touch layer.

The bonding layer group 130 is disposed between the display function layer group 110 and the touch function layer group 120 and includes a transparent conductive layer. The transparent conductive layer is configured to reduce capacitance between the touch function layer group and the first electrode layer during a touch phase.

According to the touch display panel of the exemplary embodiment, on the one hand, the transparent conductive layer is disposed between the touch sensing layer and the first electrode layer, the transparent conductive layer is used to reduce the capacitance between the touch function layer group and the first electrode layer during a touch phase and can serve as a shielding layer to shield the capacitance generated between the touch sensing layer and the first electrode layer. On the other hand, since the transparent conductive layer can form a capacitor structure with the first electrode layer, the capacitance value of the capacitor structure between the transparent conductive layer and the first electrode layer is affected during touch operations, thereby reducing the interference on the touch detection signal of the touch sensing layer and thereby effectively improving the accuracy of touch signal detection.

Hereinafter, the touch display panel in an exemplary embodiment will be described in detail.

Although the first touch layer is the touch signal detection layer Rx and the second touch layer is the touch signal scan layer Tx in an exemplary embodiment, in some other exemplary embodiments of the present disclosure, the first touch layer may also be the touch signal scan layer Tx, and the second touch layer is the touch signal detecting layer Rx, which is also within the protection scope of the present disclosure.

In an exemplary embodiment, the display function layer group 110 may be display function layer group based on an OLED (Organic Light-Emitting Device). In the case where the display function layer group 110 is the display function layer group based on an OLED, the display function layer group 110 may include, in addition to the first electrode layer, an electron injection layer, an electron transport layer, a light-emitting layer, a hole transport layer, a hole injection layer, and a second electrode layer, and the second electrode layer may be an anode layer, and the first electrode layer may be a cathode layer.

Further, in an exemplary embodiment, the bonding layer group 130 is disposed between the display function layer group 110 and the touch function layer group 120 and includes an encapsulation layer TFE and a transparent conductive layer. The encapsulation layer TFE may be disposed on a surface of the transparent conductive layer close to the display function layer group to encapsulate the organic light emitting device OLED. The encapsulation layer TFE may include at least two inorganic thin film layers and an organic thin film layer disposed between the two inorganic thin film layers. The inorganic thin film layer can protect the OLED from moisture, and the organic thin film layer can protect the OLED from impurities such as dust particles or the like.

In an exemplary embodiment, the material of the transparent conductive layer may include one or more of indium tin oxide (ITO), indium zinc oxide (IZO), zinc oxide (ZnO), or indium tin zinc oxide (ITZO), but the material forming the transparent conductive layer in the exemplary embodiment of the present disclosure is not limited thereto, for example, the material forming the transparent conductive layer may further include materials such as metal nanowires, graphene or the like, which are also within the protection scope of the present disclosure.

Figure 2:
FIG. 2 schematically illustrates a structural diagram of a touch display panel according to another exemplary embodiment of the present disclosure.

Next, referring to FIG. 2, in an exemplary embodiment, the transparent conductive layer 134 may be disposed on a surface of the encapsulation layer 132 away from the first electrode layer 112. As shown in FIG. 2, in an exemplary embodiment, a transparent conductive layer 134 is formed on the encapsulation layer 132, and then an insulating layer 122 is formed on the transparent conductive layer 134, and then the touch sensing layer 124 is formed on the insulating layer 122. The touch sensing layer 124 may include a touch signal detecting layer Rx and a touch signal scan layer Tx. During a touch phase, the voltage $V_{TC}$ of the transparent conductive layer 134 is the same as the voltage $V_{TX}$ of the touch signal scan layer Tx.

Specifically, in some embodiments, the touch signal scan layer and the transparent conductive layer 134 may be connected by a signal line, and a TFT (Thin Film Transistor) is used to control the writing of the touch scan signal to the transparent conductive layer during a touch phase. For example, in the touch phase, the TFT may be turned on to write the touch scan signal to the transparent conductive layer through the signal line. Alternatively, a separate signal line may be connected to the transparent conductive layer, and during the touch phase, a voltage signal which is the same as the touch scan signal may be written into the transparent conductive layer through the signal line.

In an exemplary embodiment, the transparent conductive layer 134 functions as a shielding layer and has the same voltage as the touch signal scan layer during a touch phase. Since the capacitor structure is formed between the transparent conductive layer 134 and the first electrode layer 112, the deformation of the touch display panel caused by the touch operation on the touch display panel only affects the capacitance value of the capacitor structure between the transparent conductive layer 134 and the first electrode layer 112 and causes the change of the touch detection signal on the transparent conductive layer, but will not affect the touch detection signal on the touch signal scan layer. Thus, the technical solution provided by the present disclosure may effectively improve the accuracy of the touch detection.

Further, in an exemplary embodiment, since the voltage $V_{TC}$ of the transparent conductive layer 134 is the same as the voltage $V_{TX}$ of the touch signal scan layer Tx during a touch phase, there is no potential difference between the transparent conductive layer 134 and the touch signal scan layer Tx, which is beneficial to reducing the capacitance generated between the touch signal scan layer Tx and the first electrode layer, thereby reducing the influence of the capacitance generated between the touch sensing layer 124 and the first electrode layer 112 on the detection of the touch signal, and improving the accuracy of the touch signal detection.

In an exemplary embodiment, when the transparent conductive layer 134 is disposed on the surface of the encapsulation layer 132 away from the first electrode layer 112, the touch function layer group 120 may further include an insulating layer 122 disposed above the transparent conductive layer 134. In an exemplary embodiment, the insulating layer 122 may include an inorganic material or an organic material. The inorganic material may include silicon oxide or silicon nitride. The organic material may include one or more of acrylic resin, methacrylic resin, polyisoprene resin, ethylene resin, epoxy resin, polyurethane resin, cellulose resin, and perylene resin.

Figure 3:
FIG. 3 schematically illustrates a structural diagram of a touch display panel according to still another exemplary embodiment of the present disclosure.

Further, referring to FIG. 3, in an exemplary embodiment, the touch signal detecting layer 128 and the touch signal scan layer 124 of the touch sensing layer 120 may be in different layers, and an insulating layer 126 exists between the touch signal detecting layer 128 and the touch signal scan layer 124. Under such case, during a touch phase, the touch signal scan layer 124 and the transparent conductive layer 134 have the same voltage during the touch phase. As shown in FIG. 3, in an exemplary embodiment, a transparent conductive layer 134 is formed on the encapsulation layer 132, and then the insulating layer 122 is formed on the transparent conductive layer 134, and then the touch signal scan layer 124, the insulating layer 126, and the touch signal detecting layer 128 are sequentially formed on the insulating layer 122, the voltage $V_{TC}$ of the transparent conductive layer 134 is the same as the voltage $V_{TX}$ of the touch signal scan layer 124.

Figure 4:
FIG. 4 schematically illustrates a structural diagram of a touch display panel according to another exemplary embodiment of the present disclosure.

In addition, referring to FIG. 4, in an exemplary embodiment, the transparent conductive layer 134 may also be disposed in the encapsulation layer. Under such case, the encapsulation layer may include a first encapsulation layer 136 and a second encapsulation layer 132, and the transparent conductive layer 134 may be disposed between the first encapsulation layer 136 and the second encapsulation layer 132. As shown in FIG. 4, in an exemplary embodiment, an encapsulation layer (i.e., the second encapsulation layer 132) is formed on the first electrode layer 112, and then the transparent conductive layer 134 is formed on the second encapsulation layer 132, and then the first encapsulation layer 136 is formed on the transparent conductive layer 134, and then the touch sensing layer 122 is formed on the first encapsulation layer 136. The touch sensing layer 122 may include a touch signal detection layer Rx and a touch signal scan layer Tx, and the voltage $V_{TC}$ of the transparent conductive layer 134 is the same as the voltage $V_{TX}$ of the touch signal scan layer Tx.

Figure 5:
FIG. 5 schematically illustrates a structural diagram of a touch display panel according to another exemplary embodiment of the present disclosure.

Further, as shown in FIG. 5, in an exemplary embodiment, when the transparent conductive layer 134 is disposed in the encapsulation layer, that is, between the first encapsulation layer 136 and the second encapsulation layer 132, the touch function layer group 120 can also include the insulating layer 122, which is disposed on a surface of the first encapsulation layer 136 away from the first electrode layer 112. As shown in FIG. 5, in an exemplary embodiment, an encapsulation layer (i.e., the second encapsulation layer 132) is formed on the first electrode layer 112, and then the transparent conductive layer 134 is formed on the second encapsulation layer 132, and then the first encapsulation layer 136 is formed on the transparent conductive layer 134, and then the insulating layer 122 is formed on the first encapsulation layer 136, and then the touch signal scan layer 124, the insulating layer 126, and the touch signal detecting layer 128 are sequentially formed on the insulating layer 122, and the voltage $V_{TC}$ of the transparent conductive layer 134 is the same as the voltage $V_{TX}$ of the touch signal scan layer 124.

It should be noted that, in an exemplary embodiment, the first electrode layer 112 may be formed using a transparent conductive material or a metal according to a type of the first electrode layer 112, such as a transparent electrode or a reflective electrode. The transparent conductive material may include ITO, ZTO, IZO, $ZnO_x$, $SnO_x$, GIZO, AZO, or the like. The metal may include, for example, Ag, Al, Pt, Au, Cr, W, Mo, Ti, Pd, etc. or an alloy of these materials. The first electrode layer may be obtained by a sputtering process, a chemical vapor deposition (CVD) process, an atomic layer deposition (ALD) process, a vacuum deposition process, a printing process, or the like.

In addition, in an exemplary embodiment, a touch display panel driving method is further provided for driving the touch display panel according to the above embodiments. The touch display driving method may include: applying the same voltage signal to the transparent conductive layer and the touch sensing layer during a touch phase.

According to the touch display panel driving method of the exemplary embodiment, the same voltage signal is applied to the transparent conductive layer and the touch sensing layer during the touch phase. Since the transparent conductive layer can form a capacitor structure with the first electrode layer, the capacitance value of the capacitor structure between the transparent conductive layer and the first electrode layer is affected during the touch operation, and the capacitance value of the touch sensing layer is not disturbed, thereby effectively improving the accuracy of the touch sensing.

In an exemplary embodiment, since the voltage signal $V_{TC}$ applied to the transparent conductive layer during the touch phase is the same as the voltage signal $V_{TX}$ applied to the touch signal scan layer Tx, there is no potential difference between the transparent conductive layer and the touch signal scan layer Tx, which is beneficial to reducing the capacitance generated between the touch signal scan layer Tx and the first electrode layer, thereby reducing the influence of the capacitance generated between the touch sensing layer and the first electrode layer on the detection of the touch signal, and improving the accuracy of the touch signal detection.

Further, in an exemplary embodiment, the touch sensing layer may include a touch signal detecting layer and a touch signal scan layer, and under such condition, the same voltage signal may be applied to the transparent conductive layer and the touch signal scan layer during the touch phase, which is also within the protection scope of the present disclosure.

In an exemplary embodiment, the transparent conductive layer, as a shielding layer, receives the same signal as the touch signal scan layer during the touch phase. Since the capacitor structure is formed between the transparent conductive layer and the first electrode layer, the deformation of the touch display panel caused by touch operations on the touch display panel only affects the capacitance value of the capacitor structure between the transparent conductive layer and the first electrode layer and causes the change of the touch detection signal on the transparent conductive layer, but does not affect the touch detection signal on the touch signal scan layer, thereby effectively improving the accuracy of the touch detection.

In addition, in an exemplary embodiment, a display device is further provided. The display device includes the touch display panel according to the above embodiments. Since the display device in the exemplary embodiment adopts the touch display panel described above, it has at least all the advantages corresponding to the touch display panel. In an exemplary embodiment, the display device may be any product or component having a display function, such as an OLED panel, a mobile phone, a tablet computer, a television, a display, a notebook computer, a digital camera, and the like and the present disclosure does not impose specific limitations on this.

Other embodiments of the present disclosure will be readily apparent to those skilled in the art upon consideration of the specification and practice of the present disclosure. The present disclosure is intended to cover any variations, uses, or adaptations of the present disclosure, which are in accordance with the general principles of the present disclosure and include common general knowledge or conventional technical means in the art that are not disclosed in herein. The specification and examples are to be considered as illustrative only, and the true scope and spirit of the disclosure is defined by the appended claims.

It should be understood that the present disclosure is not limited to the precise structures that have been described above and shown in the drawings, and various modifications and changes can be made without departing from the scope of the disclosure. The scope of the present disclosure is limited only by the appended claims.

What is claimed is:

1. A touch display panel, comprising:
a display function layer group configured to implement a display function and comprising a cathode layer;
a touch function layer group configured to implement a touch function and comprising a touch sensing layer which comprises a touch signal detecting layer and a touch signal scan layer; and
a bonding layer group disposed between the display function layer group and the touch function layer group and comprising a transparent conductive layer, wherein the transparent conductive layer is configured to reduce capacitance between the touch function layer group and the cathode layer during a touch phase;
wherein a voltage of the transparent conductive layer and a voltage of the touch signal scan layer are the same during the touch phase, and a signal line is connected to the transparent conductive layer and another signal line is connected to the touch signal scan layer to provide voltages to the transparent conductive layer and the touch signal scan layer;
wherein the bonding layer group further comprises a first encapsulation layer disposed on a surface of the transparent conductive layer away from the display function layer group and a second encapsulation layer disposed on a surface of the transparent conductive layer closest to the display function layer group;
wherein each of the first and second encapsulation layers comprises at least two inorganic thin film layers and an organic thin film layer disposed between the at least two inorganic thin film layers.

2. The touch display panel according to claim 1, wherein the bonding layer group further comprises an encapsulation layer disposed on the surface of the transparent conductive layer closest to the display function layer group.

3. The touch display panel according to claim 2, wherein the touch function layer group further comprises a first insulating layer disposed on the surface of the transparent conductive layer away from the display function layer group.

4. The touch display panel according to claim 1, wherein the touch function layer group further comprises a second insulating layer disposed on a surface of the first encapsulation layer away from the display function layer group.

5. The touch display panel according to claim 1, wherein the touch signal detecting layer and the touch signal scan layer are in a same layer.

6. A display device, comprising a touch display panel, wherein the touch display panel comprises:
a display function layer group configured to implement a display function and comprising a cathode layer;
a touch function layer group configured to implement a touch function and comprising a touch sensing layer which comprises a touch signal detecting layer and a touch signal scan layer;
a bonding layer group disposed between the display function layer group and the touch function layer group and comprising a transparent conductive layer, wherein the transparent conductive layer is configured to reduce capacitance between the touch function layer group and the cathode layer during a touch phase;
wherein a voltage of the transparent conductive layer and a voltage of the touch signal scan layer are the same during the touch phase, and a signal line is connected to the transparent conductive layer and another signal line is connected to the touch signal scan layer to provide voltages to the transparent conductive layer and the touch signal scan layer;

wherein the bonding layer group further comprises a first encapsulation layer disposed on a surface of the transparent conductive layer away from the display function layer group and a second encapsulation layer disposed on a surface of the transparent conductive layer closest to the display function layer group;

wherein each of the first and second encapsulation layers comprises at least two inorganic thin film layers and an organic thin film layer disposed between the at least two inorganic thin film layers.

7. The display device according to claim 6, wherein the bonding layer group further comprises an encapsulation layer disposed on the surface of the transparent conductive layer closest to the display function layer group.

8. The display device according to claim 7, wherein the touch function layer group further comprises a first insulating layer disposed on the surface of the transparent conductive layer away from the display function layer group.

9. The display device according to claim 6, wherein the touch function layer group further comprises a second insulating layer disposed on a surface of the first encapsulation layer away from the display function layer group.

10. The display device according to claim 6, wherein the touch signal detecting layer and the touch signal scan layer are in a same layer.

11. A method for driving a touch display panel, wherein the touch display panel comprises:

a display function layer group configured to implement a display function and comprising a cathode layer;

a touch function layer group configured to implement a touch function and comprising a touch sensing layer which comprises a touch signal detecting layer and a touch signal scan layer;

a bonding layer group disposed between the display function layer group and the touch function layer group and comprising a transparent conductive layer, wherein the transparent conductive layer is configured to reduce capacitance between the touch function layer group and the cathode layer during a touch phase;

wherein the bonding layer group further comprises a first encapsulation layer disposed on a surface of the transparent conductive layer away from the display function layer group and a second encapsulation layer disposed on a surface of the transparent conductive layer closest to the display function layer group;

wherein each of the first and second encapsulation layers comprises at least two inorganic thin film layers and an organic thin film layer disposed between the at least two inorganic thin film layers;

wherein the method comprises:

applying a same voltage signal to the transparent conductive layer and the touch signal scan layer of the touch sensing layer during the touch phase through two separate signal lines, respectively.

* * * * *